US012609142B2

(12) United States Patent
Huang et al.

(10) Patent No.: US 12,609,142 B2
(45) Date of Patent: Apr. 21, 2026

(54) INVERSION SEED GENERATION USING SCRAMBLER OUTPUT SEQUENCE

(71) Applicant: SK hynix Inc., Gyeonggi-do (KR)

(72) Inventors: Pengfei Huang, San Jose, CA (US); Fan Zhang, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 125 days.

(21) Appl. No.: 18/667,444

(22) Filed: May 17, 2024

(65) Prior Publication Data

US 2025/0356887 A1     Nov. 20, 2025

(51) Int. Cl.
*G11C 7/10*         (2006.01)
*G06F 7/58*         (2006.01)

(52) U.S. Cl.
CPC ............ *G11C 7/1006* (2013.01); *G06F 7/582* (2013.01)

(58) Field of Classification Search
CPC .............................. G11C 7/1006; G06F 7/582
See application file for complete search history.

(56)                References Cited

U.S. PATENT DOCUMENTS

| | | | |
|---|---|---|---|
| 2013/0124783 A1* | 5/2013 | Yoon ................... | G06F 12/0246 |
| | | | 711/E12.008 |
| 2013/0227213 A1* | 8/2013 | Choi ......................... | G06F 5/08 |
| | | | 711/109 |
| 2018/0074791 A1* | 3/2018 | Atsumi ................... | G06F 7/584 |
| 2019/0096485 A1* | 3/2019 | Jung ...................... | G11C 16/10 |
| 2019/0189223 A1* | 6/2019 | Yun ...................... | G11C 11/5642 |
| 2021/0191656 A1* | 6/2021 | Hong ................. | G11C 16/0483 |
| 2021/0225451 A1* | 7/2021 | Seo ..................... | G11C 11/5628 |
| 2021/0311868 A1* | 10/2021 | Chen ................... | G06F 12/1408 |
| 2023/0315623 A1 | 10/2023 | Chen et al. | |

* cited by examiner

*Primary Examiner* — Amir Zarabian
*Assistant Examiner* — Bradley S Coon
(74) *Attorney, Agent, or Firm* — IP & T GROUP LLP

(57)         ABSTRACT

A method and associated memory system for randomizing memory storage data. The method and system receive at a randomizer user data and meta data having an inversion seed; generate a random sequence using a scrambling seed; generate a value for the inversion seed; XOR the user data including the meta data with the random sequence to produce an XORed sequence; and depending on the value of the inversion seed, bit-flip the XORed sequence except the inversion seed.

20 Claims, 9 Drawing Sheets

Memory Controller

PWR

CTRL

CMD

ADDR

DATA

Semiconductor Memory Device

Figure 3:
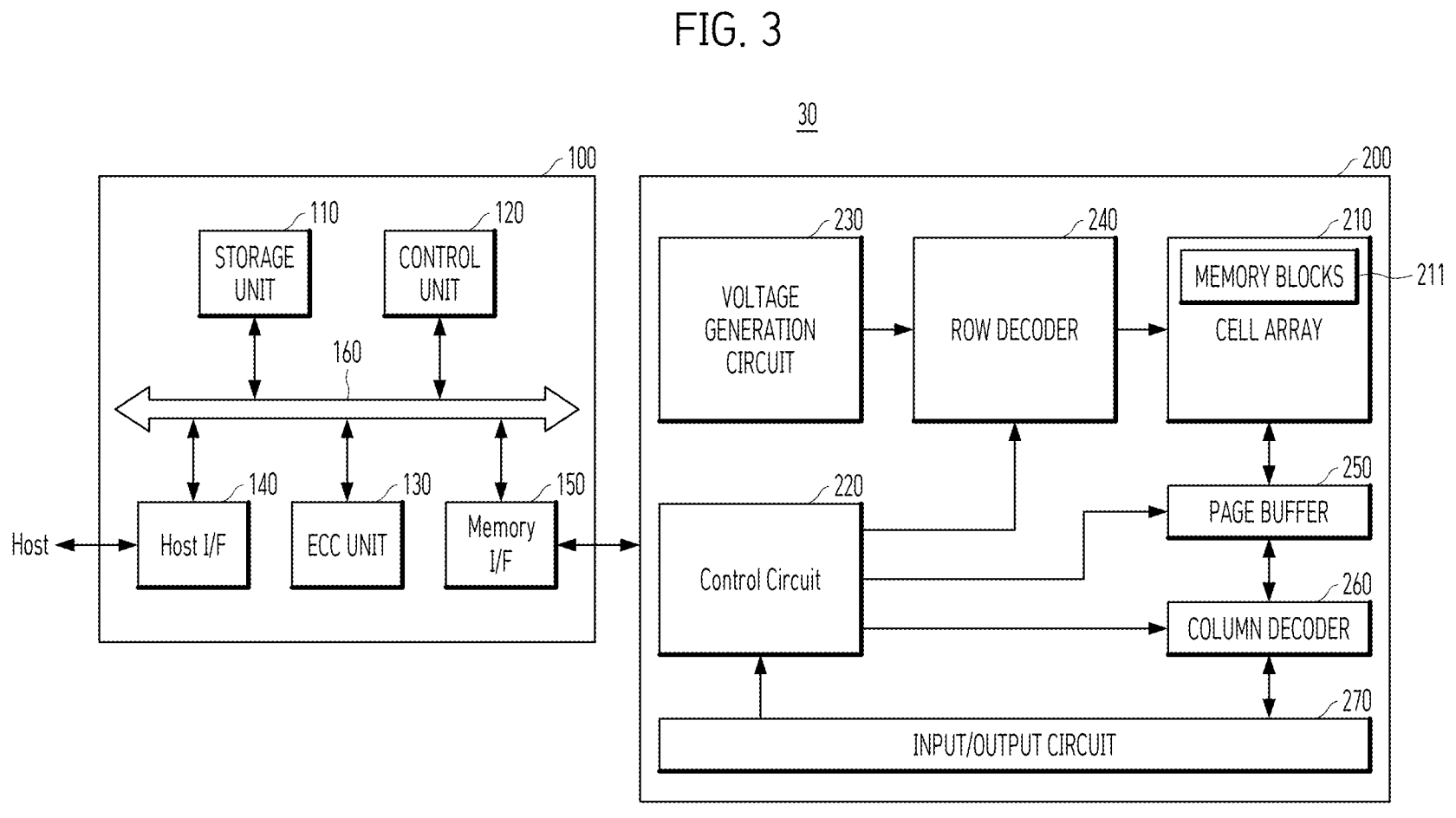

210 MEMORY BLOCKS

CELL ARRAY

240 ROW DECODER

230 VOLTAGE GENERATION CIRCUIT

250 PAGE BUFFER

260 COLUMN DECODER

220 Control Circuit

270 INPUT/OUTPUT CIRCUIT

100

120 CONTROL UNIT

110 STORAGE UNIT

150 Memory I/F

130 ECC UNIT

140 Host I/F

160

Host

FIG. 8

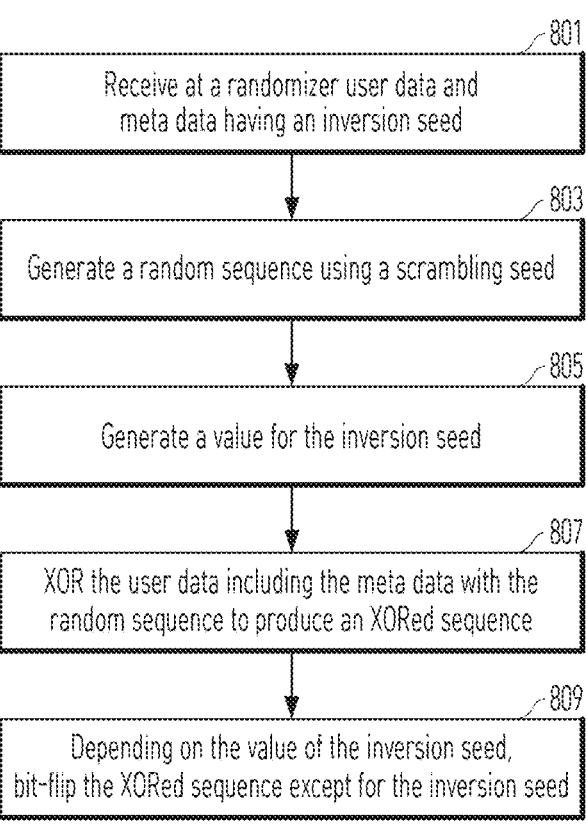

801

Receive at a randomizer user data and
meta data having an inversion seed

803

Generate a random sequence using a scrambling seed

805

Generate a value for the inversion seed

807

XOR the user data including the meta data with the
random sequence to produce an XORed sequence

809

Depending on the value of the inversion seed,
bit-flip the XORed sequence except for the inversion seed

INVERSION SEED GENERATION USING SCRAMBLER OUTPUT SEQUENCE

BACKGROUND

1. Field

The present invention relates to the writing of data to a solid-state drive (SSD) memory device.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices. Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

The SSD may include flash memory components and a controller, which includes the electronics that bridge the flash memory components to the SSD input/output (I/O) interfaces. The SSD controller can include an embedded processor that can execute functional components such as firmware. The SSD functional components are device specific, and in most cases, can be updated. The two main types of flash memory components are named after the NAND and NOR logic gates. The individual flash memory cells exhibit internal characteristics similar to those of their corresponding gates. The NAND-type flash memory may be written and read in blocks (or pages) which are generally much smaller than the entire memory space. The NOR-type flash allows a single machine word (byte) to be written to an erased location or read independently. The NAND-type operates primarily in memory cards, USB flash drives, solid-state drives, and similar products, for general storage and transfer of data.

In this context, embodiments of the present invention arise.

SUMMARY

In accordance with one embodiment of the invention, there is provided a method for randomizing memory storage data. The method receives at a randomizer user data and meta data having an inversion seed, generates a random sequence using a scrambling seed, generates a value for the inversion seed, XORs the user data including the meta data with the random sequence to produce an XORed sequence, and depending on the value of the inversion seed, bit-flips the XORed sequence except the inversion seed.

In accordance with another embodiment of the invention, there is provided a memory system comprising a storage; an encoder coupled to the storage; and a randomizer coupled to the encoder, wherein the randomizer is configured to: receive user data and meta data having an inversion seed, generate a random sequence using a scrambling seed, generate a value for the inversion seed, XOR the user data including the meta data with the random sequence to produce an XORed sequence and depending on the value of the inversion seed, bit-flip the XORed sequence except the inversion seed.

BRIEF DESCRIPTION OF THE DRAWINGS

FIG. 2 is a block diagram schematically illustrating a memory system in accordance with embodiments of the present invention.

FIG. 3 is a block diagram illustrating a memory system in accordance with embodiments of the present invention.

FIG. 8 is a flow chart illustrating a method for randomizing memory storage data in accordance with embodiments of the present invention.

DETAILED DESCRIPTION

Figure 1:
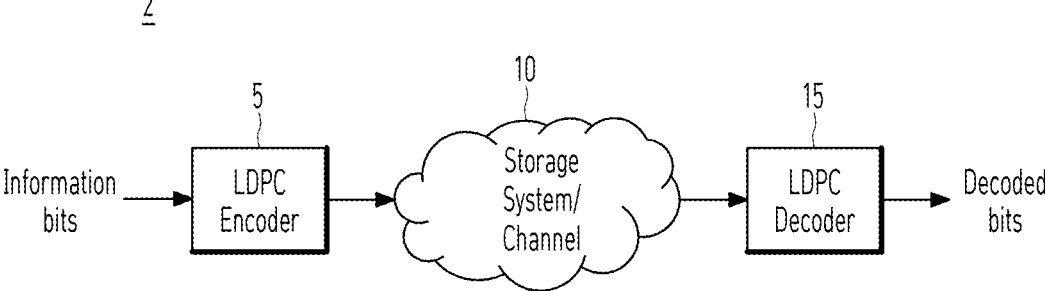
FIG. 1 is a high level block diagram illustrating an error correcting system in accordance with embodiments of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention encompasses numerous alternatives, modifications and equivalents. Numerous specific details are set forth in the following description in order to provide a thorough understanding of the invention. These details are provided for the purpose of example, and the invention may be practiced according to the claims without some or all of these specific details. For the purpose of clarity, technical material that is known in the technical fields related to the invention has not been described in detail so that the invention is not unnecessarily obscured.

FIG. 1 is a high-level block diagram illustrating an error correcting system 2, in accordance with embodiments of the present invention. More specifically, the high-level block diagram in FIG. 1 shows error correcting system 2 including an encoder 5 and a decoder 15 using for example LDPC coding and decoding algorithms. That is, error correcting system 2 may include a LDPC encoder 5 and a LDPC decoder 15, although other coding and decoding algorithms can be used.

Figure 2:
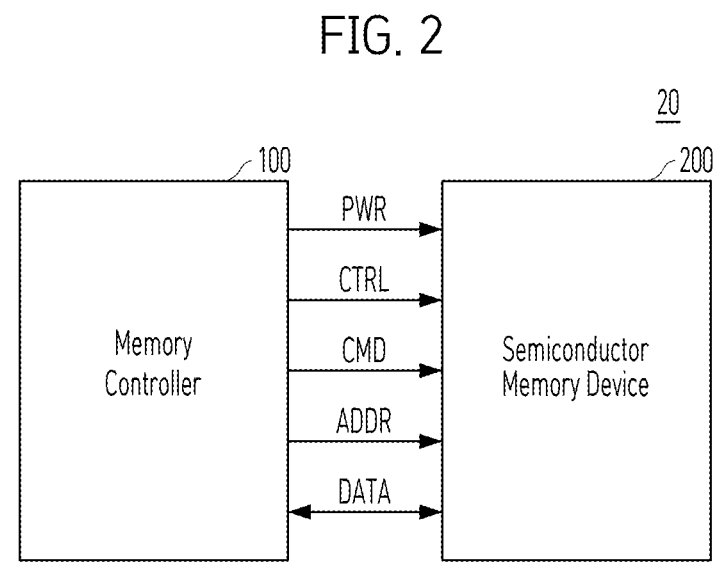

The LDPC encoder 5 may receive information bits including data which is desired to be stored in a storage system 10 (such as in memory system 20 of FIG. 2). The LDPC encoder 5 may encode the information bits to output LDPC encoded data. The LDPC encoded data from the LDPC encoder 5 may be written to a storage device or memory device of the storage system 10. In various embodiments, the storage device may include a variety of storage types or media. In some embodiments, during being written to or read from the storage device, data is transmitted and received over a wired and/or wireless channel. In this case, the errors in the received codeword may be introduced during transmission of the codeword.

When the stored data in the storage system 10 is requested or otherwise desired (e.g., by an application or user which stored the data), the LDPC decoder 15 may perform LDPC decoding data received from the storage system 10, which may include some noise or errors. In various embodiments, the LDPC decoder 15 may perform LDPC decoding using the decision and/or reliability information for the received data. The decoded bits generated by the LDPC decoder 15 are transmitted to the appropriate entity (e.g., the user or application which requested it). With proper encoding and decoding, the information bits match the decoded bits.

FIG. 2 is a block diagram schematically illustrating a memory system 20 in accordance with an embodiment of the present invention.

Referring FIG. 2, the memory system 20 may include a memory controller 100 and a semiconductor memory device 200.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 and the semiconductor memory device 200 may be integrated in a single semiconductor device. For example, the memory controller 100 and the semiconductor memory device 200 may be integrated in a single semiconductor device such as a SSD. The solid state drive may include a storage device for storing data therein. When the semiconductor memory system 20 is used in an SSD, operation speed of a host (not shown) coupled to the memory system 20 may remarkably improve.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system 20 may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

FIG. 3 is a detailed block diagram illustrating various embodiments of memory system 30 in accordance with one embodiment of the present invention. For example, memory system 30 of FIG. 3 may depict the storage system 10 shown in FIG. 1 or the memory system 20 shown in FIG. 2.

Referring to FIG. 3, the memory system 30 may include the memory controller 100 and the semiconductor memory device 200. The memory system 30 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player. The memory device 200 may store data to be accessed by the host device.

The memory device 200 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The controller 100 may control storage of data in the memory device 200. For example, the controller 100 may control the memory device 200 in response to a request from the host. The controller 100 may provide the data read from the memory device 200, to the host, and store the data provided from the host into the memory device 200. The controller 100 may include a storage unit 110, a control unit 120, the error correction code (ECC) unit 130, a host interface 140 and a memory interface 150, which are coupled through a bus 160.

The storage unit 110 may serve as a working memory of the memory system 10 and the controller 100, and store data for driving the memory system 10 and the controller 100. When the controller 100 controls operations of the memory device 200, the storage unit 110 may store data used by the controller 100 and the memory device 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the memory device 200 for the read and write operations. To store the data, the storage unit 110 may include a program memory, a data memory, a write buffer, a read buffer, a map buffer, and so forth.

Referring to FIG. 3, the control unit 120 may control general operations of the memory system 30, and a write operation or a read operation for the memory device 200, in response to a write request or a read request from the host device. The control unit 120 may drive firmware, which is referred to as a flash translation layer (FTL), to control the general operations of the memory system 10. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the memory device 200 during the read operation. The ECC unit 130 may not correct error bits when the number of the error bits is greater than or equal to a threshold number of correctable error bits, and may output an error correction fail signal indicating failure in correcting the error bits.

In some embodiments, the ECC unit 130 may perform an error correction operation based on a coded modulation such as an LDPC code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

As shown in FIG. 3, host interface 140 may communicate with the host device through one or more of various interface protocols such as a universal serial bus (USB), a multimedia card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control unit (e.g., CPU) 120. When the memory device 200 is a flash memory such as a NAND flash memory, the memory interface 150 may generate control signals for the memory and process data under the control of the control unit 120.

The memory device 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 may be connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

Figure 4:
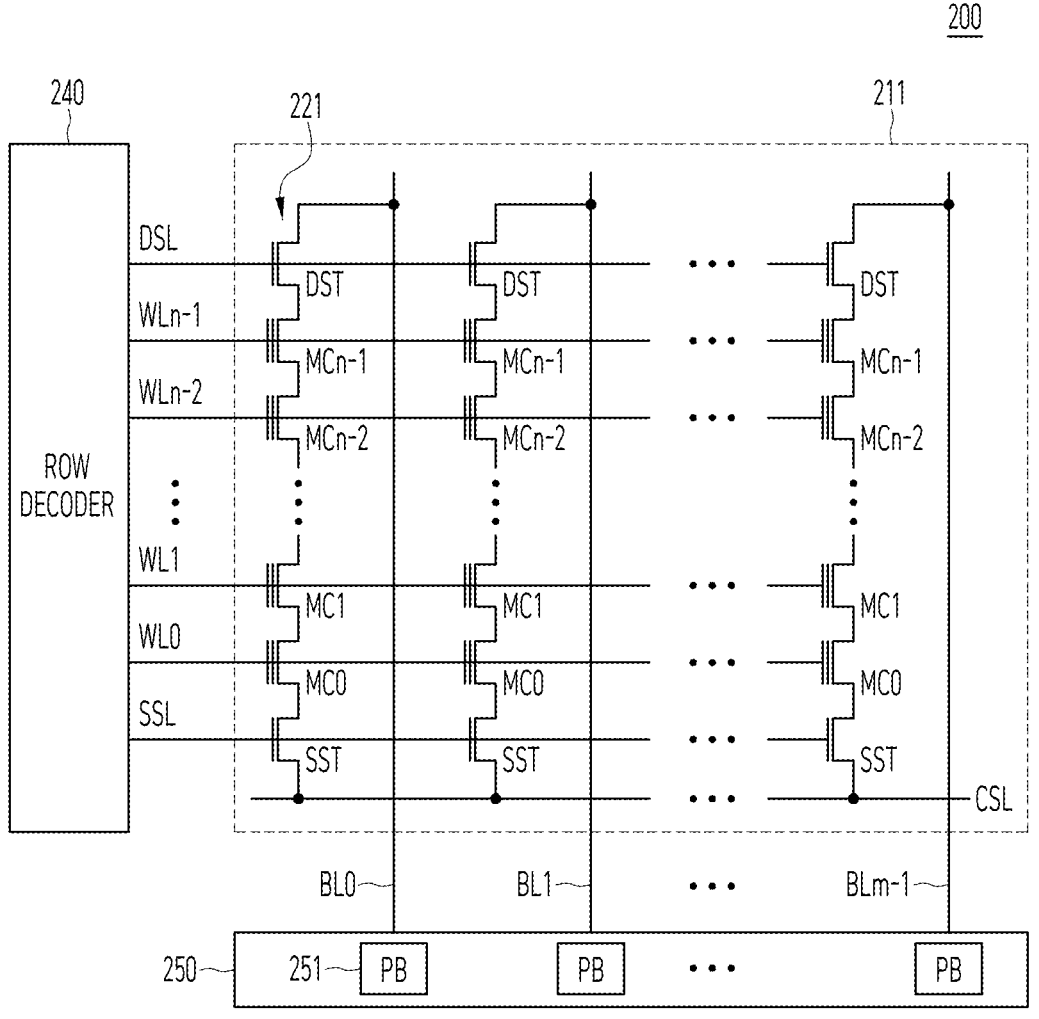
FIG. 4 is a circuit diagram illustrating a memory block of a memory device in accordance with embodiments of the present invention.

FIG. 4 is a circuit diagram illustrating a memory block of a semiconductor memory device in accordance with an embodiment of the present invention. For example, a memory block of FIG. 4 may be the memory blocks 211 of the memory cell array 210 shown in FIG. 3.

Referring to FIG. 4, the memory blocks 211 may include a plurality of cell strings 221 coupled to bit lines BL0 to BLm−1, respectively. The cell string of each column may include one or more drain selection transistors DST and one or more source selection transistors SST. A plurality of memory cells or memory cell transistors may be serially coupled between the selection transistors DST and SST. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

Figure 5:
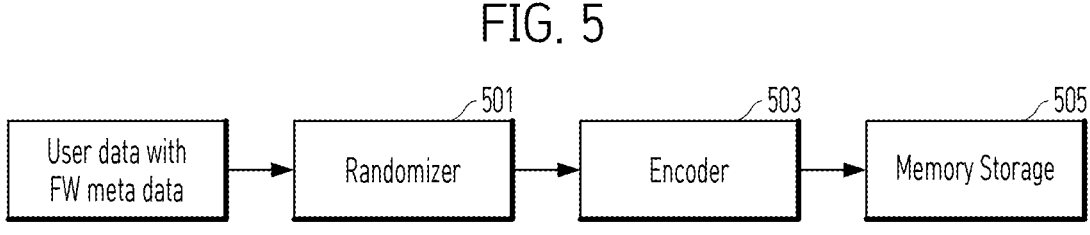
FIG. 5 is a diagram illustrating a randomizer-encoder-NAND (REN) architecture in accordance with embodiments of the present invention.

FIG. 5 is a diagram illustrating a randomizer-encoder-NAND architecture (REN). Writing the same data pattern makes an SSD wear out much faster than programming random data pattern. To promote the randomness of the input data to be programmed, in general, in an SSD, a scrambler/randomizer is applied to randomize the data from host before the NAND write operation. However, the output sequence of a scrambler is controlled by its input seed which is often determined by a physical address where the data will be programmed. Consider a scenario that the same host data is always written to a fixed physical address, e.g., a certain word line. Since the data pattern to be programmed is also fixed, as a result, the present invention recognized that this operation can wear out particular word lines where the same host data is being written more quickly than other word lines, causing endurance and reliability issues.

An advanced encryption standard (AES) engine could be used with the host data being randomized. However, firmware (FW) meta data does not typically use an AES engine, especially with single-level cell (SLC) blocks. Furthermore, there are other memory storage products which do not support AES feature.

To address the issue of writing the same data pattern to the same storage site, in different embodiments of the present invention, novel methods randomize the fixed host data by utilizing the in-built randomness of a scrambler output sequence.

As shown in FIG. 5, in the REN architecture, the user data with FW meta data is first sent to randomizer 501 (a scrambler), and then passes through encoder 503 (e.g., a low-density parity-check encoder, and before being stored in memory storage 505 (e.g. a NAND device). In randomizer 501, the data is randomized to prevent occurrence of fixed data pattern(s) being programmed to a specific site such as a word line of a NAND.

Figure 6:
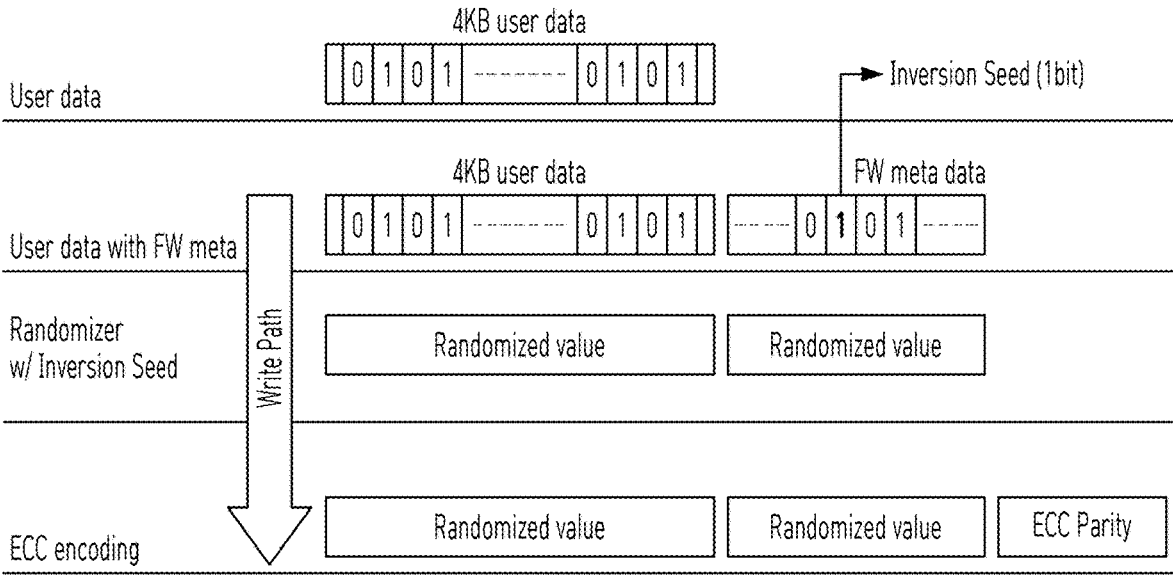
FIG. 6 is a diagram illustrating a write path in accordance with embodiments of the present invention.

FIG. 6 is a diagram illustrating a write path in accordance with embodiments of the present invention. More specifically, FIG. 6 shows the write path of the host data being programmed to memory storage 505. FIG. 6 shows at the top the user data and then shows below that the user data with the FW meta data. In the FW meta data section, there is one bit referred to herein as an inversion seed that controls whether to bit-wise flip the associated sequence of the user data with the FW meta data. FIG. 6 shows by the depicted blocks labeled "randomized value" that represent the bit values of the user data and the bit values of the FW meta data after being randomized bit-wise XORing the user data and FW meta data (regardless of being inverted) with a random sequence. Using randomizer 501, both the value of inversion seed can be generated, and the input sequence of user data and FW meta data can be randomized. FIG. 6 also shows that ECC encoding (using for example the ECC techniques described above) can encode the randomized data with an ECC parity, that is append the ECC parity to the end of the FW metadata sequence.

The inventive methods described here are advantageous in being relatively simple and only needing to rely on program erase cycles (PECs). The inventive methods described here are advantageous in not having to change existing system-on-chip programming. The inventive methods described here are advantageous in the "reusing" of existing random bit sequences, and in being implementable in hardware such as linear-feedback shift registers (LFSRs) which are relatively fast.

First Method for Inversion Seed Bit Generation

Figure 7A:
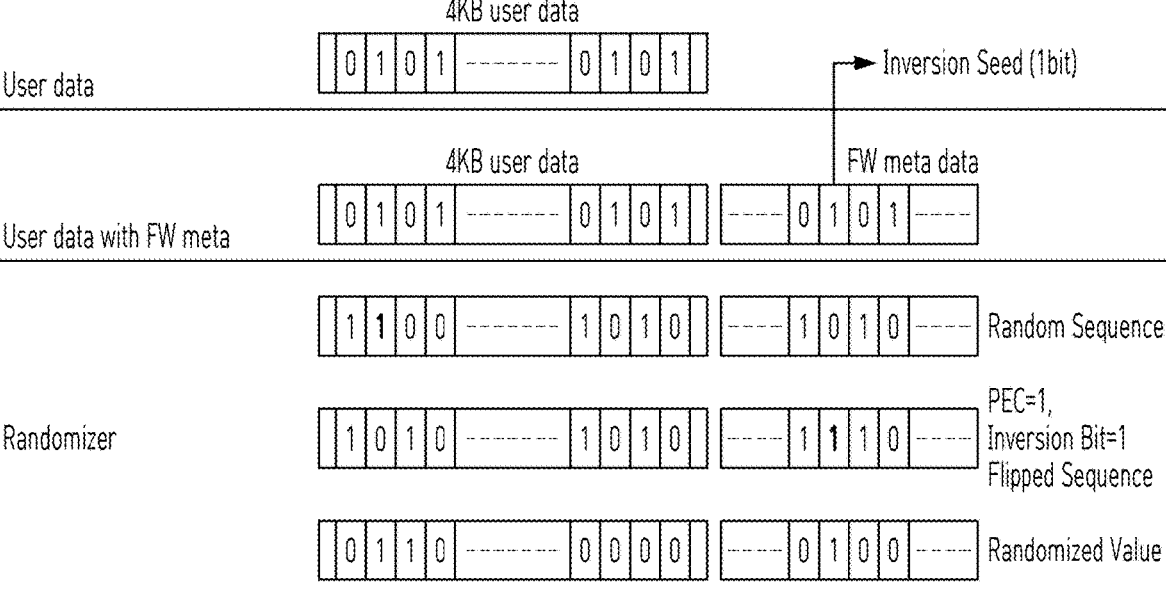
FIG. 7A is a diagram illustrating one inversion seed bit generation method in accordance with embodiments of the present invention.

In one embodiment of the present invention, as shown in FIG. 7A, the input to a randomizer (such as randomizer 501 in FIG. 5) is a user data sequence of bits X[0:n−1] and a FW meta data sequence of bits W[0:m−1], where n is the length of the user data sequence and m is the length of FW meta data sequence. As shown in FIG. 7A, the randomization procedure is as follows.

First, user data is provided along with firmware meta data including an inversion bit. Secondly, randomizer generates a random sequence (R) of length n+m, denoted by R[0:n+m−1]. Here, in one embodiment, the randomizer can be a set of LFSRs noted above, and in another embodiment, the scrambling seed for the randomizer 501 can be a NAND page physical address for storing the user data.

Thirdly, for each program erase cycle (PEC) for programming or erasing memory data from a storage site, the randomizer may generate/designate an inversion seed bit value in the FW meta data sequence W[0:m−1] as R[PEC], which stands for the PEC-th bit of random sequence R, and where the count for the number of times that there has been a program erase cycle for the storage site (where the user data and FW meta data are to be stored) the randomizer 501 may determines which bit of the random sequence R is selected. If inversion seed bit R[PEC] value is 1, the randomizer may flip all the bits in the user data sequence X[0:n−1] and flip all bits in FW metadata sequence W[0:m−1] except the inversion seed bit, and denote the resulting bit-wise flipped whole sequence as Y[0:n+m−1]. If inversion seed bit R[PEC] is 0, the resulting sequence Y[0:n+m−1] is merely the concatenation of the user data sequence of bits X and the FW meta data sequence of bits W, i.e., Y[0,n−1]=X[0, n−1] and Y[n, n+m−1]=W[0:m−1]. The randomizer 501 may bitwise exclusive OR (XOR) the random sequence R (initially generated) and sequence Y (generated above), and denote the resulting XORed sequence as Z[0:n+m−1]=XOR (R[0:n+m−1], Y[0:n+m−1]). The sequence Z is the output of the randomizer 501.

For a de-randomizing procedure, the input is the sequence Z[0:n+m−1], and the following procedures are used. The randomizer shown in FIG. 7A (e.g., with LFSRs) first generates a random sequence of length n+m, denoted by R[0:n+m−1], using the NAND page physical address (where the user data was stored) as a seed. The randomizer then bitwise XORs a) the random sequence R generated from randomizer with b) the input sequence Z. The resulting bitwise XORed sequence is denoted by Y[0:n+m−1]. If the Inversion Seed bit of Y is 1, the randomizer flips Y[0:n+m−1] (except the inversion seed bit) to produce recovered user data and FW metadata; otherwise, no action (no bit-flipping) is needed to produce the recovered user data and FW metadata.

Second Method for Inversion Seed Bit Generation

Figure 7B:
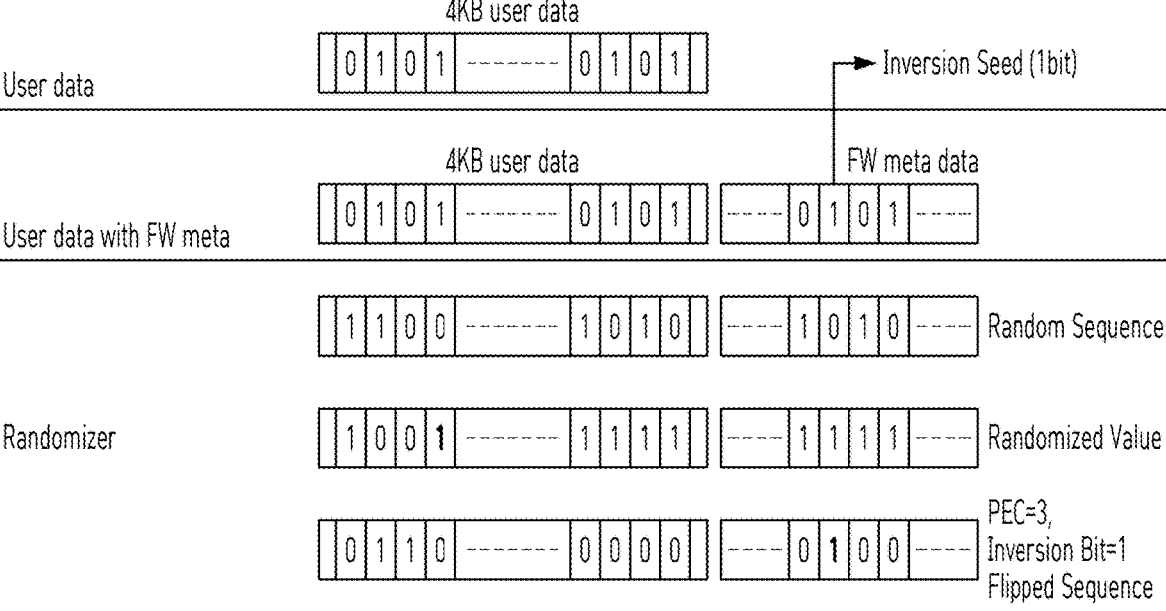
FIG. 7B is a diagram illustrating another inversion seed bit generation method in accordance with embodiments of the present invention.

In another embodiment of the present invention, as shown in FIG. 7B at the top, the user data sequence of bits X[0:n−1] and the FW meta data sequence of bits W[0:m−1] are provided to a randomizer (such as randomizer 501 shown in FIG. 5), where n is the length of the user data sequence and m is the length of FW meta data sequence. As shown in FIG. 7B, the randomization procedure has the following processes.

First, the randomizer (e.g., with LFSRs) generates a random sequence of length n+m, denoted by random sequence R[0:n+m−1]. In one embodiment, the seed of the randomizer 501 is the NAND page physical address for storing the user data.

The randomizer bitwise XORs the random sequence R (initially produced) and input sequences of user data sequence of bits X and FW meta data sequence of buts W, and denote the resulting sequence as Y[0:n+m−1].

For each PEC, the randomizer generates/designates an inversion seed bit value of Y[0:n+m−1] as Y[PEC] which stands for the PEC-th bit of Y (the bit-wise XORed sequence generated above). If inversion seed bit Y[PEC] is 1, the randomizer bit-wise flips Y (except the inversion seed bit in Y), and denotes the resulting sequence as Z[0, n+m−1]. Otherwise, if inversion seed bit Y[PEC] is 0, the output sequence Z=Y.

For a de-randomizing procedure, the input is Z[0:n+m−1], and the following processes are used: The randomizer shown in FIG. 7B generates a random sequence of length n+m, denoted by random sequence R[0:n+m−1], using the NAND page physical address (where the user data was stored) as a seed. If the Inversion Seed bit of Z is 1, the randomizer bit-flips Z[0:n+m−1] (except the inversion seed bit); otherwise, no action (no bit-flipping) is needed. Denoting the resulting sequence as Y, the randomizer bitwise XORs a) the random sequence R noted above with b) resulting sequence Y to produce the recovered user data and FW data.

Alternatives

In the first method above, for the inversion seed R[PEC], the inversion seed can be set to R[(PEC+PA) % n], where n is the length of the user data, PEC is the count for the number of times that there has been a program erase cycle for the storage site where the user data and FW meta data are to be stored, PA is the NAND page physical address where the. user data is to be stored, and % n represents a modulo operation.

In the second method, for the inversion seed Y[PEC], the inversion seed can be set to Y[(PEC+PA) % n], where n is the length of user data, PEC is the count for the number of times that there has been a program erase cycle for the storage site where the user data and FW meta data are to be stored, PA is the NAND page physical address where the user data is to be stored, and on represents a modulo operation.

Computerized Method

In one embodiment of the present invention, there is provided a method (as depicted in FIG. 8) for randomizing memory storage data. This method may be implemented in control unit 120, ECC unit 130 or control circuit 220 of FIG. 3 or may be implemented in randomizer 501 of FIG. 5. In this method at 801, at a randomizer, user data and meta data having an inversion seed is received. At 803, a random sequence is generated using a scrambling seed. At 805, a value for the inversion seed is generated. At 807, the user data is XORed with the random sequence to produce an XORed sequence. At 809, depending on the value of the inversion seed, the XORed sequence (except the inversion seed) is bit-flipped (or remains as XORed).

In one embodiment of this method, if the value of the inversion seed is 1, the method may bit-wise flip the XORed sequence (except the inversion seed) and output the bit-wise flipped XORed sequence for storage in a memory.

In one embodiment of this method, if the value of the inversion seed is 0, the method may output the XORed sequence for storage in a memory.

In one embodiment of this method, at each program-erase cycle (PEC) for programming or erasing memory data, the value for the inversion seed is equal to a value of a PEC-th bit of the random sequence.

In another embodiment of this method, at each program-erase cycle (PEC) for programming or erasing memory data, the value for the inversion seed is equal to a value of a (PEC+PA) % n-th bit of the random sequence, where n is the length of user data and PA is a page physical address for storage of the user data.

In another embodiment of this method, at each program-erase cycle (PEC), the value for the inversion seed is equal to a value of a PEC-th bit of the XORed sequence.

In another embodiment of this method, at each program-erase cycle (PEC) for programming or erasing memory data, the value for the inversion seed is equal to a value of a (PEC+PA) % n-th bit of the XORed sequence, where n is the length of user data and PA is a NAND page physical address for storage of the user data.

In one embodiment of this method, the XORed sequence or the bit-flipped XORed sequence is stored in a memory as a randomized data sequence with (in either case) the inversion seed unchanged.

In one embodiment of this method, the randomized data sequence stored in the memory has an error correction code appended thereto.

In another embodiment of this method, the method may decode the randomized data sequence stored in the memory to recover the user data and the meta data.

In one method for decoding the randomized data sequence, the method may a) input the randomized data sequence to the randomizer, b) generate a random sequence using as a seed a page physical address where the user data was stored, c) bitwise XOR the random sequence and the randomized data sequence to produce a resultant XORed sequence, d) if the inversion seed bit of Y is 1, bit-wise flip the resultant XORed sequence except the inversion seed bit to produce recovered user data and the meta data, and e) if the inversion seed bit of Y is 0, the resultant XORed sequence without bit flipping is the recovered user data and the meta data.

In another method for decoding the randomized data sequence, the method may a) input the randomized data sequence to the randomizer, b) generate a random sequence using as a seed a page physical address where the user data was stored, c) if the inversion seed bit of Y is 1, bit-wise flip the randomized data sequence except the inversion seed bit, and d) bitwise XOR the random sequence and the randomized data sequence or the bit-wise flipped randomized data sequence to obtain the user data and the meta data.

Memory System

In another embodiment of the present invention, there is provided a memory system (such as in FIG. 3) having a storage (such as for example storage 505 in FIG. 5) and an encoder (such as for example encoder 503 in FIG. 5) coupled to the storage. The memory system has a randomizer (such as for example randomizer 501 in FIG. 5) coupled to the encoder. The randomizer is configured to: receive user data and meta data having an inversion seed; generate a random sequence using a scrambling seed; generate a value for the inversion seed; XOR the user data including the meta data with the random sequence to produce an XORed sequence; and depending on the value of the inversion seed, bit-flip the XORed sequence except the inversion seed.

In one embodiment of the memory system, if the value of the inversion seed is 1, the XORed sequence is bit-wise flipped except the inversion seed and the bit-wise flipped XORed sequence is programmed in the storage.

In one embodiment of the memory system, if the value of the inversion seed is 0, the XORed sequence is programmed in the storage.

In one embodiment of the memory system, at each program-erase cycle (PEC) for programming or erasing memory data, the value for the inversion seed is equal to a value of a PEC-th bit of the random sequence.

In another embodiment of the memory system, at each program-erase cycle (PEC) for programming or erasing memory data, the value for the inversion seed is equal to a value of a (PEC+PA) % n-th bit of the random sequence, where n is the length of user data and PA is a page physical address for storage of the user data.

In another embodiment of the memory system, at each program-erase cycle (PEC) for programming or erasing memory data, the value for the inversion seed is equal to a value of a PEC-th bit of the XORed sequence.

In another embodiment of the memory system, at each program-erase cycle (PEC) for programming or erasing memory data, the value for the inversion seed is equal to a value of a (PEC+PA) % n-th bit of the XORed sequence, where n is the length of user data and PA is a NAND page physical address for storage of the user data.

In one embodiment of the memory system, the XORed sequence or the bit-flipped XORed sequence is stored in a memory as a randomized data sequence with the inversion seed unchanged and having an error correction code appended thereto.

In another embodiment of the memory system, the encoder is further configured to decode the randomized data sequence stored in the memory to recover the user data and the meta data by: a) inputting the randomized data sequence to the randomizer; b) generating a random sequence using as a seed a page physical address where the user data was stored; c) bitwise XORing the random sequence and the randomized data sequence to produce a resultant XORed sequence; d) if the inversion seed bit of Y is 1, bit-wise flipping the resultant XORed sequence except the inversion seed bit to produce recovered user data and the meta data; and e) if the inversion seed bit of Y is 0, the resultant XORed sequence without bit flipping is the recovered user data and the meta data.

In another embodiment of the memory system, the encoder is further configured to decode the randomized data sequence stored in the memory to recover the user data and the meta data by: a) inputting the randomized data sequence to the randomizer; b) generating a random sequence using as a seed a page physical address where the user data was stored; c) if the inversion seed bit of Y is 1, bit-wise flipping the randomized data sequence except the inversion seed bit; and d) bitwise XORing the random sequence and the randomized data sequence or the bit-wise flipped randomized data sequence to obtain the user data and the meta data.

Although the foregoing embodiments have been described in some detail for purposes of clarity of understanding, the invention is not limited to the details provided. There are many alternative ways of implementing the invention. The disclosed embodiments are illustrative and not restrictive. The present invention is intended to embrace all modifications and alternatives of the disclosed embodiment. Furthermore, the disclosed embodiments may be combined to form additional embodiments.

Indeed, implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations, one or more features from a combination can in some cases be excised from the combination, and the combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for randomizing memory storage data, comprising:

receiving at a randomizer user data and meta data having an inversion seed;

generating a random sequence using a scrambling seed;

generating a value for the inversion seed;

exclusive ORing (XORing) the user data including the meta data with the random sequence to produce an XORed sequence; and depending on the value of the inversion seed, bit-flipping the XORed sequence except the inversion seed.

2. The method of claim 1, wherein the bit-flipping includes, if the value of the inversion seed is 1, bit-wise flipping the XORed sequence except the inversion seed and output the bit-wise flipped XORed sequence for storage in a memory.

3. The method of claim 1, wherein the bit-flipping includes, if the value of the inversion seed is 0, outputting the XORed sequence for storage in a memory.

4. The method of claim 1, wherein, at each program-erase cycle (PEC) for programming or erasing memory data, the value for the inversion seed is equal to a value of a PEC-th bit of the random sequence.

5. The method of claim 1, wherein, at each program-erase cycle (PEC) for programming or erasing memory data, the value for the inversion seed is equal to a value of a (PEC+PA) % n-th bit of the random sequence, where n is a length of user data and PA is a page physical address for storage of the user data.

6. The method of claim 1, wherein, at each program-erase cycle (PEC) for programming or erasing memory data, the value for the inversion seed is equal to a value of a PEC-th bit of the XORed sequence.

7. The method of claim 1, wherein, at each program-erase cycle (PEC) for programming or erasing memory data, the value for the inversion seed is equal to a value of a (PEC+PA) % n-th bit of the XORed sequence, where n is a length of user data and PA is a NAND page physical address for storage of the user data.

8. The method of claim 1, wherein the XORed sequence or the bit-flipped XORed sequence is stored in a memory as a randomized data sequence with the inversion seed unchanged and having an error correction code appended thereto.

9. The method of claim 8, further comprising decoding the randomized data sequence stored in the memory to recover the user data and the meta data by:

a) inputting from the memory to the randomizer the randomized data sequence stored in the memory;

b) generating in the randomizer a random number sequence using as a seed a page physical address where the user data was stored;

c) bitwise XORing the random number sequence generated in the randomizer and the randomized data sequence input from the memory to produce a resultant XORed sequence;

d) after the bitwise XORing, if a bit of the inversion seed is 1, bit-wise flipping the resultant XORed sequence except the inversion seed bit to produce recovered user data and the meta data; and e) after the bitwise XORing, if the bit of the inversion seed is 0, the resultant XORed sequence without bit flipping is the recovered user data and the meta data.

10. The method of claim 8, further comprising decoding the randomized data sequence stored in the memory to recover the user data and the meta data by:

a) inputting the randomized data sequence stored in the memory to the randomizer;

b) generating in the randomizer a random number sequence using as a seed a page physical address where the user data was stored;

c) after the generating of the random number sequence in the randomizer, if a bit of the inversion seed is 1, bit-wise flipping the randomized data sequence input from the memory except the inversion seed bit; and d) bitwise XORing the random number sequence generated in the randomizer and the bit-wise flipped randomized data sequence to obtain the user data and the meta data.

11. A memory system, comprising:

a storage;

an encoder coupled to the storage; and a randomizer coupled to the encoder, wherein the randomizer is configured to:

receive user data and meta data having an inversion seed;

generate a random sequence using a scrambling seed;

generate a value for the inversion seed;

exclusive OR (XOR) the user data including the meta data with the random sequence to produce an XORed sequence; and depending on the value of the inversion seed, bit-flip the XORed sequence except the inversion seed.

12. The memory system of claim 11, wherein, if the value of the inversion seed is 1, the XORed sequence is bit-wise flipped except the inversion seed and the bit-wise flipped XORed sequence is programmed in the storage.

13. The memory system of claim 11, wherein, if the value of the inversion seed is 0, the XORed sequence is programmed in the storage.

14. The memory system of claim 11, wherein, at each program-erase cycle (PEC) for programming or erasing memory data, the value for the inversion seed is equal to a value of a PEC-th bit of the random sequence.

15. The memory system of claim 11, wherein, at each program-erase cycle (PEC) for programming or erasing memory data, the value for the inversion seed is equal to a value of a (PEC+PA) % n-th bit of the random sequence, where n is a length of user data and PA is a page physical address for storage of the user data.

16. The memory system of claim 11, wherein, at each program-erase cycle (PEC) for programming or erasing memory data, the value for the inversion seed is equal to a value of a PEC-th bit of the XORed sequence.

17. The memory system of claim 11, wherein, at each program-erase cycle (PEC) for programming or erasing memory data, the value for the inversion seed is equal to a value of a (PEC+PA) % n-th bit of the XORed sequence, where n is a length of user data and PA is a NAND page physical address for storage of the user data.

18. The memory system of claim 11, wherein the XORed sequence or the bit-flipped XORed sequence is stored in a memory as a randomized data sequence with the inversion seed unchanged and having an error correction code appended thereto.

19. The memory system of claim 18, wherein the encoder is configured to decode the randomized data sequence stored in the memory to recover the user data and the meta data by:

a) inputting from the memory to the randomizer the randomized data sequence stored in the memory;

b) generating in the randomizer a random number sequence using as a seed a page physical address where the user data was stored;

c) bitwise XORing the random number sequence generated in the randomizer and the randomized data sequence input from the memory to produce a resultant XORed sequence;

d) after the bitwise XORing, if a bit of the inversion seed is 1, bit-wise flipping the resultant XORed sequence except the inversion seed bit to produce recovered user data and the meta data; and e) after the bitwise XORing, if the bit of the inversion seed is 0, the resultant XORed sequence without bit flipping is the recovered user data and the meta data.

20. The memory system of claim 18, wherein the encoder is configured to decode the randomized data sequence stored in the memory to recover the user data and the meta data by:

a) inputting the randomized data sequence stored in the memory to the randomizer;

b) generating in the randomizer a random number sequence using as a seed a page physical address where the user data was stored;

c) after the generating of the random number sequence in the randomizer, if a bit of the inversion seed is 1, bit-wise flipping the randomized data sequence input from the memory except the inversion seed bit; and d) bitwise XORing the random number sequence generated in the randomizer and the bit-wise flipped randomized data sequence to obtain the user data and the meta data.

* * * * *